United States Patent
Boudet et al.

(10) Patent No.: US 8,422,182 B2
(45) Date of Patent: Apr. 16, 2013

(54) RELAY SYSTEM COMPRISING TWO JFET TRANSISTORS IN SERIES

(75) Inventors: Thierry Boudet, Echirolles (FR); Sebastien Carcouet, Vif (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 313 days.

(21) Appl. No.: 12/934,899

(22) PCT Filed: Mar. 11, 2009

(86) PCT No.: PCT/EP2009/052845
§ 371 (c)(1),
(2), (4) Date: Sep. 27, 2010

(87) PCT Pub. No.: WO2009/124818
PCT Pub. Date: Oct. 15, 2009

(65) Prior Publication Data
US 2011/0026185 A1    Feb. 3, 2011

(30) Foreign Application Priority Data
Apr. 9, 2008   (FR) ...................................... 08 52367

(51) Int. Cl.
*H02H 3/20* (2006.01)
(52) U.S. Cl.
USPC ........................................ 361/91.1; 361/93.1
(58) Field of Classification Search ........................ None
See application file for complete search history.

(56) References Cited

U.S. PATENT DOCUMENTS

| | | | |
|---|---|---|---|
| 3,058,034 A * | 10/1962 | Sandin | 361/58 |
| 3,873,887 A | 3/1975 | Barkan et al. | |
| 5,008,565 A | 4/1991 | Taylor | |
| 5,132,865 A * | 7/1992 | Mertz et al. | 361/6 |
| 5,953,189 A * | 9/1999 | Abot et al. | 361/13 |
| 6,778,366 B2 * | 8/2004 | Finney | 361/18 |
| 7,432,613 B2 * | 10/2008 | Jabaji et al. | 307/10.6 |
| 2006/0049426 A1 * | 3/2006 | Lee et al. | 257/194 |

FOREIGN PATENT DOCUMENTS

| | | |
|---|---|---|
| DE | 197 25 870 | 1/1999 |
| DE | 10 2006 022158 | 11/2007 |
| WO | 93 11608 | 6/1993 |

OTHER PUBLICATIONS

WO9311608 "Power Switch" Jun. 10, 1993. Zierhut, Hermann. pp. 1-3.*
Cooper, J. A. et al., "SiC Power-Switching Devices—The Second Electronics Revolution?", Proceedings of the IEEE, vol. 90, No. 6, pp. 956-968, (Jun. 1, 2002) XP011065017.
International Search Report issued Apr. 29, 2009 in PCT/EP09/052845 filed Mar. 11, 2009.

* cited by examiner

*Primary Examiner* — Jared Fureman
*Assistant Examiner* — Terrence Willoughby
(74) *Attorney, Agent, or Firm* — Oblon, Spivak, McClelland, Maier & Neustadt, L.L.P.

(57) ABSTRACT

A static relay system configured to be connected in series with an electrical load supplied with AC current, including: two series-connected field-effect transistors fabricated in a material having a high bandgap energy; a detector detecting a threshold of a voltage across the terminals of each of the transistors or of the two transistors; an electromechanical relay connected in series with the transistors; and a controller for opening at least one transistor or the electromechanical relay when the threshold voltage is exceeded.

8 Claims, 1 Drawing Sheet

RELAY SYSTEM COMPRISING TWO JFET TRANSISTORS IN SERIES

The present invention relates to a solid-state relay system intended to be connected in series with an electrical load powered by alternative current.

Figure 1:
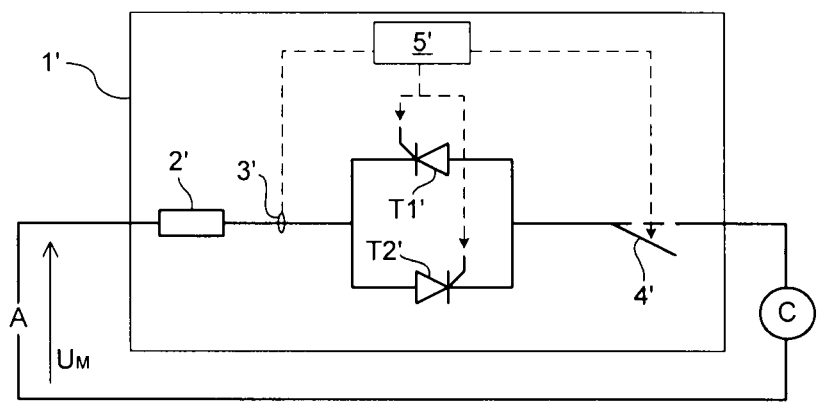

There are solid-state relay systems 1' (SSR) as represented in FIG. 1 that notably incorporate thyristor-type power switches T1', T2', a fuse 2' or a circuit breaker to protect the switches, a current sensor 3' and an electromechanical relay 4'. Control means 5' are used to switch off the thyristors and the electromechanical relay 4' when the intensity of the current measured by the current sensor 3' exceeds a determined threshold. This type of system has the following drawbacks:
- the thermal dissipation of the two thyristors T1', T2' is significant so that the use of a dissipator to cool the components is necessary. The relay is therefore particularly bulky,
- the fuse 2' or a circuit breaker is necessary to protect the circuit. After a short circuit, the fuse must be replaced or the circuit breaker must be rearmed,
- the current sensor 3' is a particularly costly element.

The aim of the invention is to propose a simple and inexpensive solid-state relay system which does not require intervention after a short circuit and in which the thermal dissipation is low.

This aim is achieved by a solid-state relay system intended to be connected in series with an electrical load powered by alternative current, characterized in that the system comprises:
- two series-mounted bidirectional field-effect transistors made of a wide band-gap material and able to operate in current limiting mode,
- means for detecting a threshold of a voltage at the terminals of each of the transistors or of both transistors,
- an electromechanical relay mounted in series with the transistors,
- control means for switching off at least one transistor or the electromechanical relay when the voltage threshold is exceeded.

Advantageously, both transistors are of JFET type.

According to a particular feature, both JFET-type transistors are linked by their source.

According to another particular feature, the transistors are made of silicon carbide or gallium nitride.

According to the invention, both transistors are, for example, of normally-on JFET type, the gates of which are connected together, the system then comprising:
- two biasing resistors, each biasing resistor being respectively linked between the gate and the source of one of the power transistors,
- two control switches controlled by the control means, each control switch being respectively connected in parallel with one of the biasing resistors.

In the latter configuration, the system also comprises two limiting zener diodes connected in parallel with the biasing resistors.

The control switches are, for example, MOSFET-type transistors, the sources of which are connected together and to the gates of the transistors, and the drains of which are linked to the source of a corresponding transistor. The gate of each MOSFET transistor is then connected to the control means via a gate resistor. In a variant embodiment, the control switches are, for example, MEMS-type microswitches controlled using a coil powered by the control means.

Figure 2:
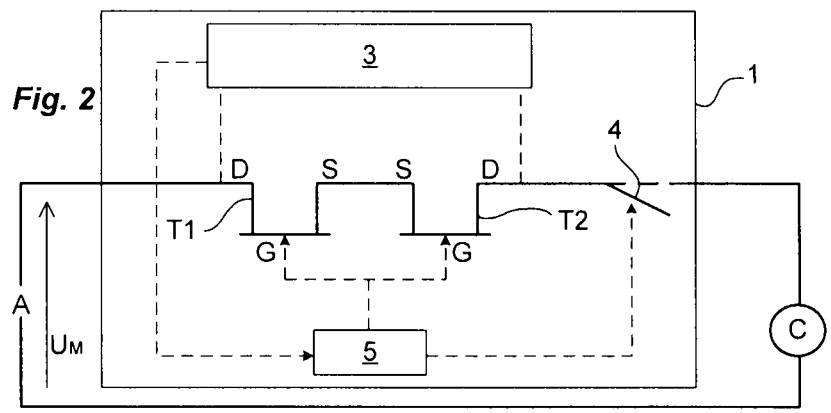
Figure 3:
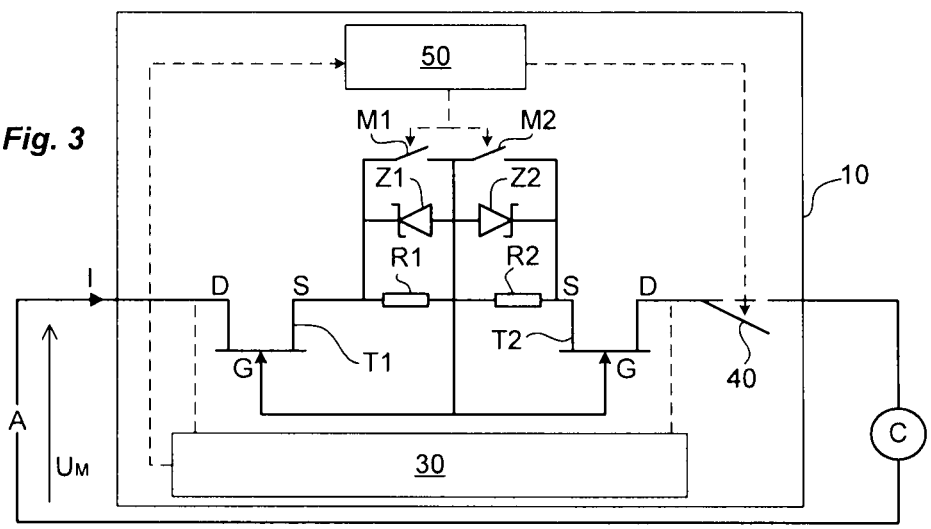

Other features and advantages will emerge from the following detailed description by referring to an embodiment given as an example and represented by the appended drawings in which:

FIG. 1 represents a solid-state relay system according to the prior art connected to an electrical load, FIG. 2 represents a solid-state relay system according to the invention connected to an electrical load, in which the transistors are of normally-off type, FIG. 3 represents a solid-state relay system according to the invention connected to an electrical load, in which the transistors are of normally-on type.

FIG. 1 has already been described hereinabove.

With reference to FIGS. 2 and 3, the solid-state relay system 1, 10 is intended to control an electrical load C powered by alternative current from a power source A.

The solid-state relay system 1, 10 of the invention comprises two bidirectional field-effect transistors T1 and T2, for example identical, mounted in series, more specifically in head-to-tail configuration, and made of a wide band-gap material, that is to say, a material that exhibits a low resistance in the on state $R_{DSon}$ and that is capable of withstanding high voltages (greater than 1000 V), such as, for example, silicon carbide or gallium nitride (GaN).

These field-effect transistors T1, T2 are preferably of the junction type, that is to say of JFET (Junction Field Effect Transistor) type. A JFET transistor is a known power electronic switch which comprises a control gate (G), the function of which is to allow or prevent the passage of a current between a drain (D) and a source (S). Such a transistor is said to be of the normally on type if the drain-source path is on or conducting in the absence of control voltage $V_{GS}$ between gate and source. Conversely, a JFET transistor is said to be of the normally off type if the drain-source path is not conducting in the absence of voltage $V_{GS}$ between gate and source.

Control means 5, 50 are used to apply one and the same voltage $V_{GS}$ to the gates (G) of the two transistors in order to simultaneously switch both transistors off or on.

The solid-state relay system 1, 10 also comprises a relay, for example of electromechanical type, controlled by the control means according to a voltage measured at the terminals of each of the transistors T1 and T2 or at the terminals of both transistors T1 and T2 at the same time. If a current overload is detected, the electromechanical relay 4, 40 is switched off to protect the transistors. For this, means 3, 30 of detecting a voltage threshold are mounted in parallel with each of the two transistors T1 or T2 or both transistors T1 and T2 (as in FIGS. 2 and 3) to detect the current overload flowing through the transistors. In effect, when the current that flows through a JFET transistor is greater than its limiting current, the transistor switches to limiting mode, leading to an increase in its internal resistance. Because of this, the voltage at the terminals of the transistor also increases. The means 3, 30 of detecting the voltage threshold comprise, for example, an assembly comprising a resistor, an optocoupler and a transit or zener diode mounted in series, this assembly being mounted in parallel with each of the transistors or with both transistors in series. In a variant embodiment, it is possible to provide for one of the transistors or both transistors to be switched off when the current overload is detected. In this case, the electromechanical relay 4, 40 may be switched off subsequently, simply to provide the circuit with galvanic isolation.

In FIG. 2, the two JFET transistors T1, T2 that are used are of normally-off type. Both transistors T1, T2 are connected together by their sources (S), the drain (D) of the first transistor T1 is connected to the power source A whereas the drain (D) of the second transistor T2 is connected to the load C. The control means 5 directly apply one and the same voltage $V_{GS}$ to both gates (G) of the transistors T1, T2 to switch them on.

In FIG. 3, both JFET transistors T1, T2 of the solid-state relay system 10 are of the normally-on type. Currently, a JFET transistor made of a wide band-gap material and of normally-on type offers better performance characteristics than other voltage-control transistor types, such as MOSFETs, IGBTs or even normally-off type JFET transistors. In practice, such a transistor notably offers the advantages of being faster to switch, of generating lower conduction losses in the on state (low resistance $R_{DSon}$ in the on state), of having a better temperature resistance and of having a smaller size.

When both transistors T1, T2 are of the normally-on type, it is, however, necessary to provide a device with which to keep the circuit off in the absence of a control signal sent by the control means.

The solid-state relay system 10 thus comprises two biasing resistors R1 and R2 and two control switches M1 and M2 controlled by the control means 50. The transistors T1 and T2 have their gates (G) linked together. The transistors T1, T2 are mounted head-to-tail in series with the load C so that the drain (D) of the transistor T1 is linked to the AC network, the drain (D) of the transistor T2 is linked to one end of the load C, and the sources (S) of the transistors T1, T2 are linked together through the biasing resistors R1, R2. Each resistor R1, respectively R2, is therefore connected between the gate and the source of a transistor T1, respectively T2. Preferably, the transistors T1 and T2 are identical, as are the resistors R1 and R2.

Each control switch M1, respectively M2, is connected in parallel with one of the biasing resistors R1, respectively R2. The control switches M1, M2 may be electromechanical components, such as mini-relays or MEMS (Micro-Electro-Mechanical Switches), or preferably semiconductor electronic components such as low voltage MOSFET transistors. In the case of electromechanical components, the control means send a control signal into excitation coils of M1 and M2. In the case of semiconductor electronic components, this control signal is sent to the gates of the components M1 and M2, via a gate resistor.

The solid-state relay system 10 may also include two identical protection zener diodes Z1 and Z2 connected in parallel with the biasing resistors R1 and R2. The cathode of Z1, respectively Z2, is linked to the source of the transistor T1, respectively T2, and the anode of Z1, respectively Z2, is linked to the gate of the transistor T1, respectively T2. These zener diodes protect the JFET transistors because they make it possible to always limit the gate-source voltages $V_{GS}$ between their zener voltage $V_Z$ (or breakdown voltage) in one direction (around −15 V for example) and their direct voltage drop in the other direction (+0.7 V for example).

The embodiment of FIG. 3 works as described below:

a. It is assumed at the outset that the mains voltage $U_M$ is zero (the relay 40 is off), and therefore the voltages between gate and source $V_{GS1}$, respectively $V_{GS2}$, of the JFET transistors T1, respectively T2, are zero, which means that they are on, because the transistors T1 and T2 are of normally-on type. It is also assumed that there is no control signal sent by the control means 50 and therefore that the control switches M1, M2 are in the off state.

b. When a mains voltage $U_M$ appears (the relay 40 is on), for example a so-called positive arch, a current I begins to flow in T1, R1, R2, T2 in the direction indicated by the arrow in FIG. 3. This current I very quickly generates a positive voltage $V_{R1}$ at the terminals of the resistor R1. Since $V_{R1}=-V_{GS1}$ by construction, the positive voltage $V_{R1}$ creates a negative voltage $V_{GS1}$ between gate and source of the JFET transistor T1. The value of R1 is chosen so that $V_{GS1}$ quickly reaches the blocking voltage (or pinch-off voltage) $V_P$ that is used to switch the JFET transistor T1 to the off state. The current flowing through R1 then drops until $V_{GS1}$ rises back above the blocking voltage $V_P$, which makes the JFET transistor T1 once again slightly on. The current I will then increase again until $V_{R1}$ once again reaches the blocking voltage $V_P$ so as to block T1 again, and so on. During this positive arch, the JFET transistor T1 is mounted as a current source, the current thus being fixed by the resistor R1 and the blocking voltage $V_P$.

Thus, the arrangement of T1 and R1 means that, during a positive arch, the current I is less than or equal to a residual current of very low value $I_{min}$, well below the value needed to correctly power the load C.

Moreover, during this positive arch, the zener diode Z1 is blocked and the zener diode Z2 is on. The voltage $V_{Z2}$ at the terminals of Z2 is therefore equal to the direct voltage drop of a zener diode (generally around 0.7 V), which makes it possible to limit the voltage $V_{R2}$ at the terminals of R2 and therefore limit the positive value of the voltage $V_{GS2}$, so as to avoid gate problems for the transistor T2.

c. During the subsequent negative arch, the current I changes direction and the operation is similar to that described above with the resistor R2 and the JFET transistor T2. The current I flowing in the negative direction very rapidly leads to a positive voltage $V_{R2}$ at the terminals of the resistor R2. Since $V_{R2}=-V_{GS2}$ by construction, the positive voltage $V_{R2}$ creates a negative voltage $V_{GS2}$ between gate and source of the JFET transistor T2. The value of R2 is chosen so that $V_{GS2}$ quickly reaches the blocking voltage $V_P$ which is used to switch the JFET transistor T2 to the off state. During this negative arch, the JFET transistor T2 is mounted as a current source, the current thus being fixed by the resistor R2 and the blocking voltage $V_P$.

Thus, in the absence of a control signal on the control switches M1, M2, the current I flowing in the load C remains permanently less than or equal to $I_{min}$, which makes it possible to ensure with total safety that the electrical load is not controlled in the absence of a control signal.

d. When a control signal appears, the control switches M1 and M2 switch on, which causes the resistors R1 and R2 to be shunted. The voltages $V_{R1}$, $V_{R2}$ therefore become practically zero (around a few tens of millivolts only), because $V_{R1}=R_{onM1}*I$, in which $R_{onM1}$ is the on-state resistance of the low-voltage MOSFET transistor M1 which is very low and I is the current flowing in the load C. This also causes the gate-source voltages $V_{GS1}$ and $V_{GS2}$ of the transistors T1 and T2 to be forced to zero. The transistors T1 and T2 then both become on and the electrical load C is powered, regardless of the direction of the current I.

Advantageously, when a current defect occurs, such as, for example, a short circuit, both transistors T1 and T2 can switch to saturation mode from a certain current level in order to thus limit the current to a low value, significantly less than a fault current.

Obviously it is possible, without departing from the scope of the invention, to imagine other variants and refinements of detail and even consider the use of equivalent means.

The invention claimed is:

1. A solid-state relay system configured to be connected in series with an electrical load powered by alternative current, comprising:
two series-mounted bidirectional field-effect transistors made of a wide band-gap material and configured to operate in a current limiting mode;

a voltage detector to detect voltage across each of the transistors or across both transistors;

an electromechanical relay mounted in series with the transistors; and a controller to switch off at least one transistor or the electromechanical relay when the detected voltage exceeds a threshold, wherein both transistors are of normally-on JFET type, gates of which are connected together, and wherein the system further comprises:

two biasing resistors, each biasing resistor being respectively linked between the gate and the source of one of the power transistors;

two control switches controlled by the controller, each control switch being respectively connected in parallel with one of the biasing resistors.

2. The solid-state relay system as claimed in claim 1, wherein the JFET-type transistors are linked by their sources.

3. The solid-state relay system as claimed in claim 1, wherein the JFET-type transistors are made of silicon carbide.

4. The solid-state relay system as claimed in claim 1, wherein the JFET-type transistors are made of gallium nitride.

5. The solid-state relay system as claimed in claim 1, further comprising two limiting zener diodes connected in parallel with the biasing resistors.

6. The solid-state relay system as claimed in claim 1, wherein the control switches are MOSFET-type transistors, sources of which are connected together and to gates of the transistors, and drains of which are linked to the source of a corresponding transistor.

7. The solid-state relay system as claimed in claim 6, wherein a gate of each MOSFET transistor is connected to the controller via a gate resistor.

8. The solid-state relay system as claimed in claim 1, wherein the control switches are MEMS-type microswitches controlled using a coil powered by the controller.

\* \* \* \* \*